(12) United States Patent
Kumano et al.

(10) Patent No.: US 11,652,496 B2
(45) Date of Patent: May 16, 2023

(54) MEMORY SYSTEM AND METHOD FOR CONTROLLING NON-VOLATILE MEMORY

(71) Applicant: Kioxia Corporation, Tokyo (JP)

(72) Inventors: Yuta Kumano, Kawasaki Kanagawa (JP); Hironori Uchikawa, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/463,818

(22) Filed: Sep. 1, 2021

(65) Prior Publication Data

US 2022/0278695 A1 Sep. 1, 2022

(30) Foreign Application Priority Data

Mar. 1, 2021 (JP) .............................. JP2021-031909

(51) Int. Cl.
*H03M 13/15* (2006.01)
*G06F 11/10* (2006.01)

(52) U.S. Cl.
CPC ..... *H03M 13/1565* (2013.01); *G06F 11/1068* (2013.01)

(58) Field of Classification Search
CPC ........................ G06F 11/1068; H03M 13/1565
See application file for complete search history.

(56) References Cited

U.S. PATENT DOCUMENTS

| 11,309,918 | B2* | 4/2022 | Kumano | H03M 13/1108 |
| 2017/0269839 | A1* | 9/2017 | Alrod | G06F 3/0679 |
| 2019/0089384 | A1* | 3/2019 | Kumano | G06F 11/108 |
| 2019/0312593 | A1* | 10/2019 | Hsiao | G06F 11/1068 |
| 2020/0089417 | A1* | 3/2020 | Kifune | G06F 3/0658 |

FOREIGN PATENT DOCUMENTS

JP 2019-57752 A 4/2019

* cited by examiner

*Primary Examiner* — Guy J Lamarre
(74) *Attorney, Agent, or Firm* — Foley & Lardner LLP (57) ABSTRACT

A memory system of an embodiment includes a non-volatile memory and a memory controller. The memory controller executes a first decoding process of reading data encoded by an error correction code from the non-volatile memory and repeatedly executing bounded distance decoding on a symbol group protected by each of component codes included in N component code groups; executes a second decoding process of repeatedly executing decoding exceeding a bounded distance in units of component codes for an error symbol group determined to include an error due to a syndrome of a component code included in the N component code groups when the first decoding process fails; executes a rollback process when the first decoding process executed after the second decoding process fails; and changes a parameter used in the second decoding process and further executes the second decoding process when it is detected that the second decoding process is not progressed.

20 Claims, 8 Drawing Sheets

| NUMBER OF TIMES OF EXECUTION OF 4-BIT CORRECTION PROCESS \ ROW NUMBER | 1 | 2 | 3 | 4 |
|---|---|---|---|---|
| FIRST TIME | × | × | × | ○ |
| SECOND TIME | × | × |  |  |
| THIRD TIME |  |  | × | × |

FIG.9

| NUMBER OF TIMES OF EXECUTION OF 4-BIT CORRECTION PROCESS \ ROW NUMBER | 1 | 2 | 3 | 4 |
|---|---|---|---|---|
| FIRST TIME | × | × | ○ |  |
| SECOND TIME | × |  |  | × |
| THIRD TIME |  | × | × |  |

FIG.10

MEMORY SYSTEM AND METHOD FOR CONTROLLING NON-VOLATILE MEMORY

CROSS-REFERENCE TO RELATED APPLICATIONS

This application is based upon and claims the benefit of priority from Japanese Patent Application No. 2021-031909, filed on Mar. 1, 2021; the entire contents of which are incorporated herein by reference.

FIELD

Embodiments described herein relate generally to a memory system.

BACKGROUND

In general, data after being subjected to error correction coding is stored in memory systems in order to protect the data to be stored. For this reason, decoding is performed on the data after being subjected to the error correction coding when reading data stored in the memory system.

DETAILED DESCRIPTION

A memory system of an embodiment includes a non-volatile memory and a memory controller. The memory controller executes a first decoding process of reading data encoded by an error correction code from the non-volatile memory and repeatedly executing bounded distance decoding on data protected by each of component codes included in N component code groups; executes a second decoding process of repeatedly executing decoding exceeding a bounded distance in units of component codes for an error symbol group determined to include an error due to a syndrome of the N component code groups when the first decoding process fails; executes a rollback process when the first decoding process executed after the second decoding process fails; and changes a parameter used in the second decoding process and further executes the second decoding process when it is detected that the second decoding process is not progressed.

Hereinafter, the memory system according to the embodiment will be described in detail below with reference to the attached drawings. Incidentally, the present invention is not limited to the following embodiment.

Figure 1:
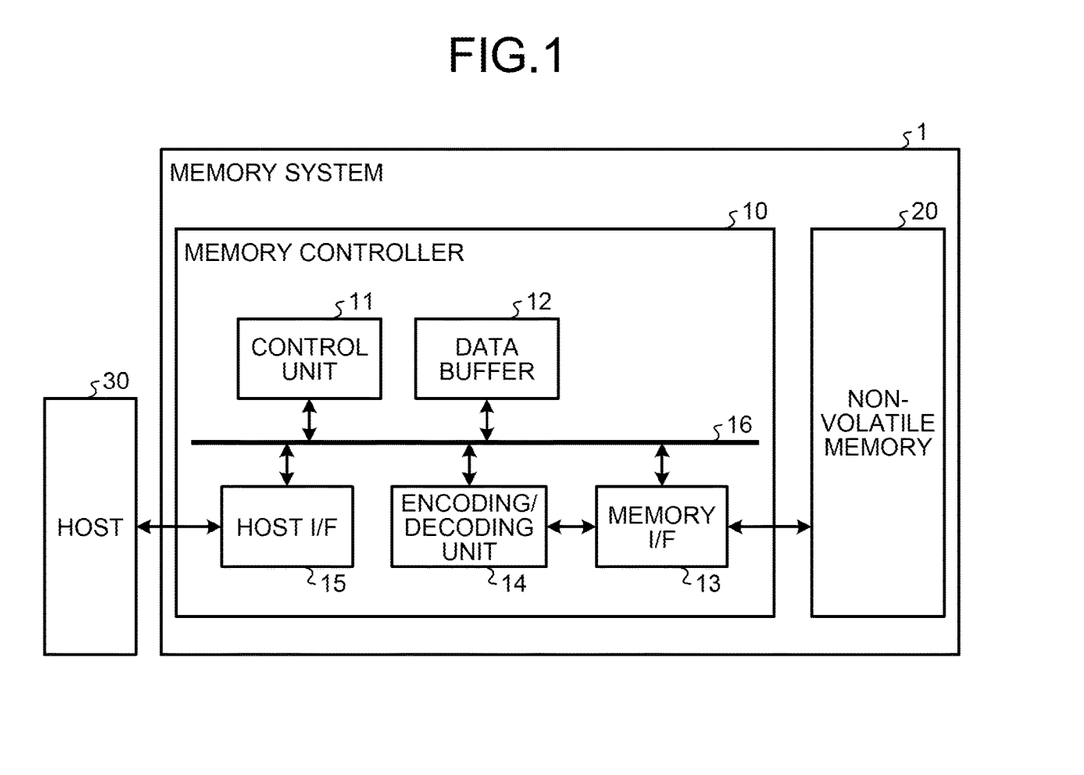
FIG. 1 is a block diagram illustrating a schematic configuration example of a memory system according to the embodiment.

FIG. 1 is a block diagram illustrating a schematic configuration example of the memory system according to the embodiment. As illustrated in FIG. 1, a memory system 1 includes a memory controller 10 and a non-volatile memory 20. The memory system 1 is capable of being connected with a host 30, and FIG. 1 illustrates a state where the memory system 1 is connected with the host 30. The host 30 may be electronic equipment, for example, a personal computer, a mobile phone, or the like.

The non-volatile memory 20 is a non-volatile memory that stores data in a non-volatile manner, and is, for example, a NAND flash memory (hereinafter simply referred to as a NAND memory). Although the following description exemplifies a case where a NAND memory is used as the non-volatile memory 20, a storage device other than the NAND memory, such as a three-dimensional structure flash memory, a resistance random access memory (ReRAM), or a ferroelectric random access memory (FeRAM), may be used as the non-volatile memory 20. Further, it is not essential that the non-volatile memory 20 be a semiconductor memory, and the embodiment can be also applied to various storage media other than the semiconductor memory.

The memory system 1 may be a memory card or the like in which the memory controller 10 and the non-volatile memory 20 are configured as a single package, or may be a solid state drive (SSD) or the like.

The memory controller 10 is a semiconductor integrated circuit configured as, for example, a System-On-a-Chip (SoC). Some or all of operations of the respective components of the memory controller 10 to be described below may be realized by firmware executed by a central processing unit (CPU), or may be realized by hardware.

The memory controller 10 controls write to the non-volatile memory 20 according to a write request from the host 30. Further, the memory controller 10 controls read from the non-volatile memory 20 according to a read request from the host 30. The memory controller 10 includes a host interface (host I/F) 15, a memory interface (memory I/F) 13, a control unit 11, an encoding/decoding unit (codec) 14, and a data buffer 12. The host I/F 15, the memory I/F 13, the control unit 11, the encoding/decoding unit 14, and the data buffer 12 are mutually connected via an internal bus 16.

The host I/F 15 executes a process according to the interface standard with the host 30, and outputs a request, user data to be written, and the like received from the host 30 to the internal bus 16. Further, the host I/F 15 transmits the user data which has been read from the non-volatile memory 20 and restored, a response from the control unit 11, and the like to the host 30.

The memory I/F 13 performs a write process to the non-volatile memory 20 on the basis of an instruction of the control unit 11. Further, the memory I/F 13 performs a read process from the non-volatile memory 20 on the basis of an instruction of the control unit 11.

The data buffer 12 temporarily stores the user data received from the host 30 until the memory controller 10 stores the user data in the non-volatile memory 20. Further, the data buffer 12 temporarily stores the user data read from the non-volatile memory 20 until being transmitted to the host 30. As the data buffer 12, it is possible to use a general-purpose memory, for example, a static random access memory (SRAM), a dynamic random access memory (DRAM), or the like.

The control unit 11 comprehensively controls various components of the memory system 1. In the case of receiving a request from the host 30 via the host I/F 15, the control unit 11 performs control according to the request. For example, the control unit 11 instructs the memory I/F 13 to write the user data and parity to the non-volatile memory 20 according to a write request from the host 30. For example, the control unit 11 instructs the memory I/F 13 to read the user data and parity from the non-volatile memory 20 according to a read request from the host 30.

Further, in the case of receiving the write request of the user data from the host 30, the control unit 11 determines a storage area (memory area) on the non-volatile memory 20 with respect to the user data to be accumulated in the data buffer 12. That is, the control unit 11 manages a write destination of the user data. An association between a logical address of the user data received from the host 30, and a physical address that indicates the storage area on the non-volatile memory 20 in which the user data is stored, is stored, as an address conversion table, in the data buffer 12.

Further, in the case of receiving the read request from the host 30, the control unit 11 converts the logical address designated by the read request into the physical address using the above-described address conversion table, and instructs the memory I/F 13 to perform read from the physical address.

Here, in the NAND memory, the write and read are generally performed in a data unit of a so-called page, and erase is performed in a predetermined data unit larger than the page. In the embodiment, a plurality of memory cells to be connected to the same word line are referred to as a memory cell group. In a case where the memory cell is a single-level cell (SLC), one memory cell group is associated with one page. In a case where the memory cell is a multi-level cell (MLC), one memory cell group is associated with a plurality of pages. Further, each memory cell is connected not only to the word line, but also to a bit line. Therefore, each memory cell can be identified by an address that identifies the word line, and an address that identifies the bit line.

For example, when the memory cell is a 2-bit/cell memory cell, data values of 2 bits are associated with four threshold distributions of Er, A, B, and C levels, respectively. This association is referred to as data coding. The data coding is determined in advance. At the time of writing (programming) data, a charge is injected into the memory cell so as to be at a level (threshold distribution) corresponding to a data value to be stored according to the data coding. Further, when two bits/cell are used, one memory cell group corresponds to two pages. Two bits that can be stored in each memory cell correspond to the two pages. Hereinafter, the two pages are referred to as a lower page and an upper page.

The user data transmitted from the host 30 is transferred to the internal bus 16 and temporarily stored in the data buffer 12. The encoding/decoding unit 14 encodes the user data stored in the non-volatile memory 20 with an error correction code to generate encoded data (code word). Further, the encoding/decoding unit 14 decodes the encoded data (also referred to as read information or a received word) read from the non-volatile memory 20 to restore the user data. Incidentally, the data to be encoded by the encoding/decoding unit 14 may include control data and the like to be used in the memory controller 10 in addition to the user data.

In the write process in the memory system 1 having the above configuration, the control unit 11 instructs the encoding/decoding unit 14 to encode the user data during write to the non-volatile memory 20. At this time, the control unit 11 determines a storage location (storage address) of the code word in the non-volatile memory 20, and also instructs the memory I/F 13 of the determined storage location. The encoding/decoding unit 14 encodes the user data on the data buffer 12 with an error correction code on the basis of an instruction from the control unit 11 to generate the code word. As an encoding scheme, for example, an encoding scheme using a low-density parity-check (LDPC) code, a Bose-Chaudhuri-Hocquenghem (BCH) code, or a Reed-Solomon (RS) code can be adopted. The memory I/F 13 writes the code word into the non-volatile memory 20 on the basis of an instruction from the control unit 11.

On the other hand, in the read process, the control unit 11 designates an address on the non-volatile memory 20 to instruct the memory I/F 13 to perform read during the read from the non-volatile memory 20. Further, the control unit 11 instructs the encoding/decoding unit 14 to start decoding. The memory I/F 13 executes read with respect to the designated address of the non-volatile memory 20 according to an instruction of the control unit 11, and inputs read information obtained by the read to the encoding/decoding unit 14. Then, the encoding/decoding unit 14 decodes the input read information.

The encoding/decoding unit 14 can also be used as, for example, an encoding unit and a decoding unit of each component code of a multi-dimensional error correction code. The multi-dimensional error correction code indicates a scheme in which a symbol, which is at least one or more constituent units of an error correction code, is multiply protected by a plurality of smaller component codes. At this time, one symbol is formed of, for example, one bit (an element of a binary field) or an element of an alphabet such as a finite field other than the binary field.

Figure 2:
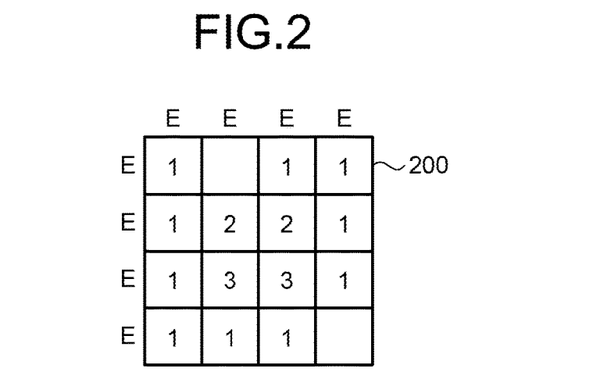
FIG. 2 is a view illustrating an example of a multi-dimensional error correction code according to the embodiment.

Here, FIG. 2 illustrates a configuration example of a product code as an example of the multi-dimensional error correction code. A product code 200 illustrated in FIG. 2 is an example of a product code in which a BCH code capable of correcting 3 bits by bounded distance decoding is used as a component code in a row direction (an example of a first component code) and a component code in a column direction (an example of a second component code). Further, the product code 200 is an example of a two-dimensional block product code including four blocks in each of the row direction and the column direction. Each block includes a plurality of symbols constituting a code. Each block corresponds to a symbol group which is a set of a plurality of symbols constituting a code.

Incidentally, the number of blocks in each of the row direction and the column direction is not limited to four. Hereinafter, an example will be described in which the BCH code capable of correcting 3 bits by the bounded distance decoding is used as the component code, but a code capable of correcting an error of n bits (n is an integer of one or more) or less by bounded distance decoding may be used. Further, any code other than the BCH may be used as the component code. For example, a Reed-Solomon code may be used as the component code of at least one of the row direction and the column direction.

In decoding of the product code as illustrated in FIG. 2, for example, the encoding/decoding unit 14 first sequentially decodes the component codes in the row direction constituting the product code. The encoding/decoding unit 14 decodes the component code by the bounded distance decoding, for example. In a case where there is a component code which is not successfully decoded among the component codes in the row direction, the encoding/decoding unit 14 corrects an error which can be corrected in the decoding of the component code in the row direction, and decodes the component codes in the column direction. In a case where there is a component code which is not successfully decoded among the component codes in the column direction, the encoding/decoding unit 14 corrects an error which can be corrected in the decoding of the component code in the column direction, and decodes the component codes in the row direction again. As described above, the decoding of the component codes in the row direction and the decoding of the component codes in the column direction are repeatedly executed until an end condition is satisfied. Hereinafter, such repeated decoding is sometimes referred to as an iterative decoding process. Further, an iterative decoding process of repeatedly executing bounded distance decoding is sometimes referred to as iterative bounded distance decoding. The product code is used to implement an encoding scheme having a high correction capability and a small calculation amount.

Incidentally, the multi-dimensional error correction code is not limited to the product code 200 illustrated in FIG. 2, and may be, for example, a generalized low density parity check (LDPC) code, for example. In general multi-dimensional error correction codes including the generalized LDPC code, the multiplicity of protection may be different for each symbol. Further, there is a case where it is difficult to group component codes in the row direction and the column direction in the general multi-dimensional error correction codes, but the present technology can also be applied to a multi-dimensional error correction code having such a code structure. Hereinafter, a case where a block product code is used as the multi-dimensional error correction code will be described as an example.

In the block product code, a plurality of symbols (for example, bits) are allocated to each block. For this reason, in a case where a large number of errors occur in one block, it is difficult to correct the errors even if decoding is repeated in the row direction and the column direction so that an error floor occurs.

FIG. 2 illustrates an example of read information read from the non-volatile memory 20. A numerical value in FIG. 2 represents the number of symbols in a block in which an error has occurred. Whether or not there is an error in each component code can be determined by, for example, whether a syndrome is zero (there is no error) or not (there is an error). A symbol "E" in FIG. 2 represents a component code for which it is determined that there is an error.

In the embodiment, in a case where there is a block including a large number of errors, a value of a symbol in this block is inverted (flipped) to perform decoding. As such a technology, for example, multi-bit flip decoding (MBFD) can be applied. Here, if a symbol as a target to be inverted is $\alpha \in GF(q)$ in a case where each symbol is constituted by elements of a finite field $GF(q)$ including q elements, the target symbol is changed to certain element of $GF(q)$ other than $\alpha$ after inversion. For example, in a case of $GF(2)=\{0, 1\}$, a target symbol is changed to 1 by inversion when the target symbol is zero, and is changed to 0 by inversion when the target symbol is 1. In the following description, it is assumed that each symbol is an element (bit) of a binary field. Hereinafter, details of the encoding/decoding unit 14 that performs such decoding will be described.

Figure 3:
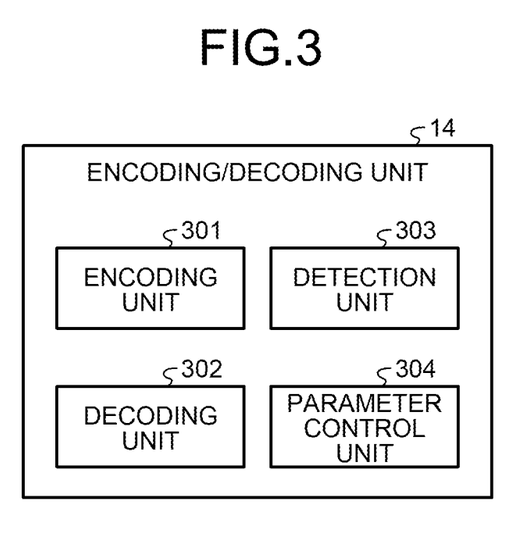
FIG. 3 is a block diagram illustrating an example of a functional configuration of an encoding/decoding unit according to the embodiment.

FIG. 3 is a block diagram illustrating an example of a functional configuration of the encoding/decoding unit 14.

FIG. 3 illustrates an example of a case where encoding and decoding of a two-dimensional product code as illustrated in FIG. 2 is performed. Hereinafter, a two-dimensional error correction code will be mainly described as an example. Each component code of each dimension includes one or more component codes determined for each dimension. Hereinafter, a component code corresponding to each dimension including one or more component codes is sometimes referred to as a component code group. For example, a component code group in the row direction and a component code group in the column direction include component codes as many as the number of rows and the component codes as many as the number of columns, respectively. The error correction code is not limited to the two-dimensional error correction code, and the same technique can be applied to a multi-dimensional error correction code, that is, an N-dimensional error correction code in which each of a plurality of symbol groups is protected by N (N is an integer of two or more) component code groups.

As illustrated in FIG. 3, the encoding/decoding unit 14 includes an encoding unit 301, a decoding unit 302, a detection unit 303, and a parameter control unit 304. The encoding unit 301 encodes component codes in the row direction and the column direction. The decoding unit 302 executes an iterative decoding process (decoding process D-A or first decoding process) of repeatedly executing bounded distance decoding on data protected by each of the component codes included in the N component code groups (the component code group in the row direction and the component code group in the column direction in the case of two dimensions). Further, in a case where the iterative decoding process fails, the decoding unit 302 executes a decoding process D-B (second decoding process) of repeatedly executing decoding (decoding for correcting an error of (n+1) bits or more) exceeding a bounded distance in units of component codes for a component code including a block (error symbol group) determined to include an error based on a syndrome of a component code included in the N component code groups (syndromes of both a component code included in the component code group in the row direction and a component code included in the component code group in the column direction in the case of two dimensions). In a case of using a BCH code capable of correcting three bits (n=3) by bounded distance decoding, the decoding process D-B realizes correction of four bits or more by flipping bits at an intersection between a row and a column where an error remains, and then, performing the bounded distance decoding (3-bit correction processing), for example. The decoding process D-B is, for example, MBFD. Hereinafter, an example in which the MBFD is used as the decoding process D-B will be described.

The MBFD is repeatedly executed on one or more component codes of a target dimension (row or column). The target dimension may be some dimensions or all dimensions. Hereinafter, the MBFD repeatedly executed for component codes of a certain target dimension is sometimes referred to as iterative MBFD. The iterative MBFD is performed in the following procedure.

(S1) One component code in which a syndrome is not zero among component codes of the target dimension is selected as a component code as a processing target (hereinafter, a target component code). Incidentally, the processing is skipped for a component code in which the syndrome is zero.

(S2) A block (block corresponding to an intersection) included in both the target component code and a component code of an opposing dimension in which the syndrome is not zero is set as a target block. The opposing dimension represents a dimension other than the target dimension. For example, when the target dimension is a dimension in the row direction, a dimension in the column direction is the opposing dimension.

(S3) A process of "selecting a symbol to be flipped, flipping the selected symbol, and executing a decoding process on a component code" in the target block is repeated until a position (flip pattern) of the symbol to be flipped is changed and decoding is successful.

(S4) If decoding is not successful even if (S3) is executed for all flip patterns, the process of (S3) is executed for another block as a target block.

(S5) After performing the MBFD on all the component codes of the target dimension, the iterative MBFD is ended. The iterative MBFD may be ended when the number of solutions adopted in the MBFD reaches an upper limit (maximum value) as will be described below.

The solution adopted in the MBFD is a component code that has been successfully decoded by the MBFD (a component code whose error is corrected by the MBFD). For example, in a case where the MBFD is executed on component codes in the row direction, an upper limit of the number of component codes in the row direction (the number of rows) for which the MBFD has succeeded corresponds to the upper limit of the number of solutions to be adopted. In one iterative MBFD, one or a plurality of component codes may be set as the processing target.

The decoding unit 302 determines component codes on which the MBFD is to be executed, in a predetermined order. For example, in a case where the MBFD is executed on component codes in the row direction, the decoding unit 302 determines the component codes for which the MBFD is executed in ascending order of row numbers, such as the first row, the second row, and so on. When the iterative MBFD is repeatedly executed, the decoding unit 302 starts the MBFD from a component code corresponding to the next order of a component code that has been processed last in the previous iterative MBFD. For example, in a case where the syndrome is not zero in both the component code in the first row and the component code in the second row and the component code that has been processed last in the previous iterative MBFD is the component code in the first row, processing is started from the component code in the second row in the iterative MBFD to be executed subsequently.

The decoding unit 302 may perform processing such as rejecting a flip pattern that flips a bit in which a syndrome of a dimension (for example, a dimension in the column direction) opposite to a dimension (for example, a dimension in the row direction) in which the MBFD is being executed is zero.

Figure 4:
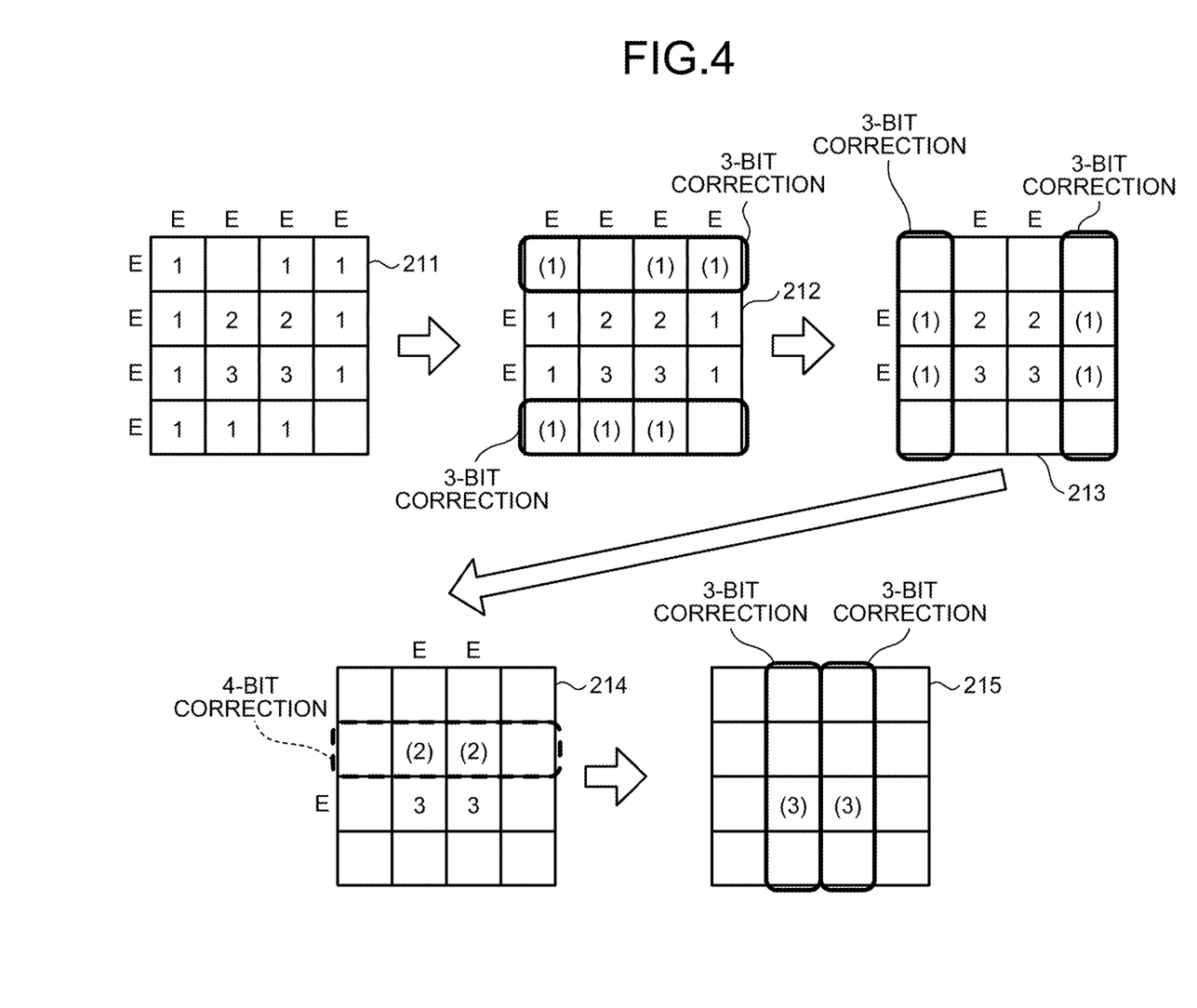
FIG. 4 is a view illustrating an execution example of a decoding process.

After executing the MBFD, the decoding unit 302 further executes an iterative decoding process (decoding process D-A). FIG. 4 is a view illustrating an example of executing the iterative decoding process and MBFD.

Data 211 corresponds to read information read from the non-volatile memory 20. The decoding unit 302 executes, for example, bounded distance decoding (3-bit correction processing) of component codes in the row direction on the data 211 to obtain decoded data 212. In the example of FIG. 4, component codes in the first and fourth rows each including a 3-bit error are decoded into codes including no error. Incidentally, a numerical value in parentheses represents the number of symbols in which no error has been caused by the decoding process.

Next, the decoding unit 302 executes bounded distance decoding (3-bit correction processing) of component codes in the column direction on the data 212 to obtain decoded data 213. In the example of FIG. 4, component codes in the first and fourth columns each including a 2-bit error are decoded into codes including no error.

Since all component codes including errors among the component codes of the data 213 include errors of 4 bits or more, decoding is not successful even if the iterative decoding process (3-bit correction processing) is further executed.

Therefore, the decoding unit 302 executes MBFD. For example, the decoding unit 302 executes the MBFD on a component code in the second row to obtain decoded data 214. As a result, the component code in the second row including a 4-bit error is decoded into a code including no error.

Thereafter, the decoding unit 302 further executes the iterative decoding process. As illustrated in FIG. 4, for example, the decoding unit 302 executes bounded distance decoding (3-bit correction processing) of component codes in the second and third columns each including a 3-bit error to obtain data 215 including no error.

FIG. 4 illustrates an example in which the 4-bit errors are positively corrected by the MBFD, but there is a case where erroneous correction occurs in the MBFD. For this reason, if the iterative decoding process to be executed subsequently is not successful, the decoding unit 302 cancels the MBFD and performs a rollback process of returning to a state before executing the MBFD.

Figure 5:
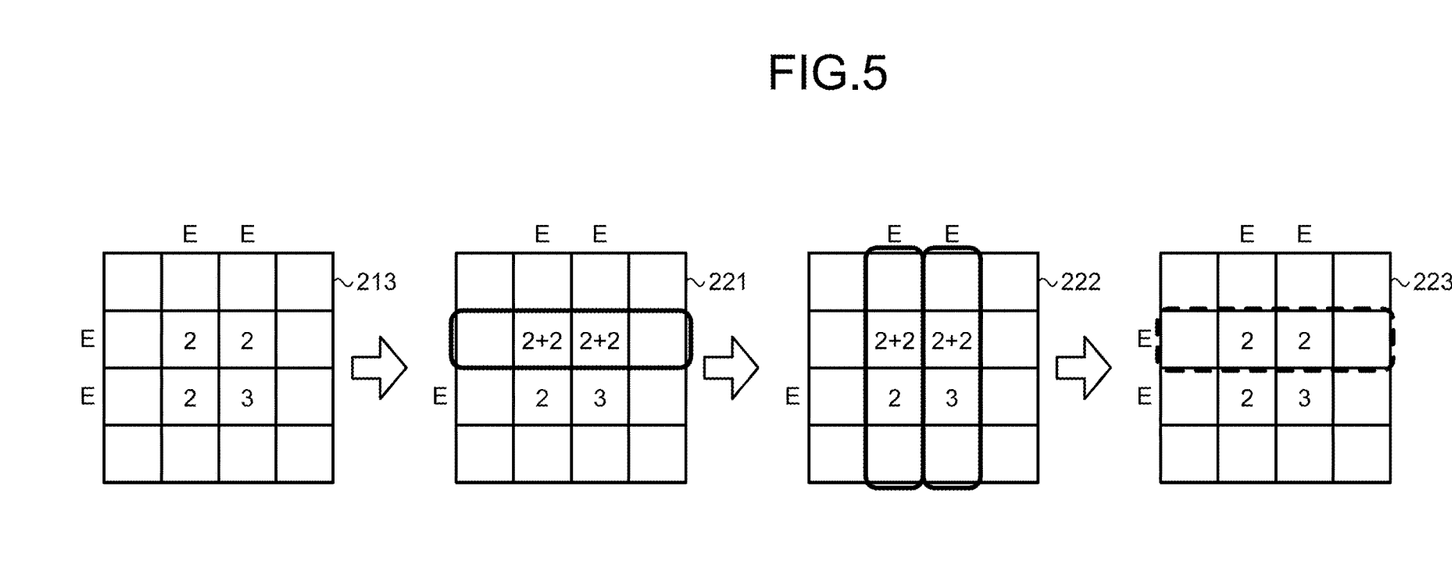
FIG. 5 is a view for describing an example of a rollback process.

FIG. 5 is a view for describing an example of the rollback process. FIG. 5 illustrates an example of executing MBFD on data 213 similar to that in FIG. 4. That is, the decoding unit 302 executes the MBFD on a component code in the second row to obtain decoded data 221. The data 221 is an example of data in which an error is not decreased, and conversely, an error is increased because erroneous correction occurs in the MBFD. Here, "+2" indicates that two errors have increased.

In such a case, the error correction fails even if the decoding unit 302 executes the bounded distance decoding (3-bit correction processing) in the column direction on the data 221. The data 222 corresponds to data of which correction has failed. In such a case, the decoding unit 302 executes the rollback process of canceling the iterative MBFD that has been executed at the immediately previous time. The data 223 corresponds to data (the same data as the data 213) that has returned to the state before executing the MBFD by the rollback process.

Thereafter, the decoding unit 302 executes MBFD in the column direction (for example, a component code in the second column) instead of the row direction. If no erroneous correction occurs in the MBFD in the column direction, subsequent bounded distance decoding (3-bit correction processing) in the row direction (for example, component codes in the second and third rows) can be successfully performed.

Figure 6:
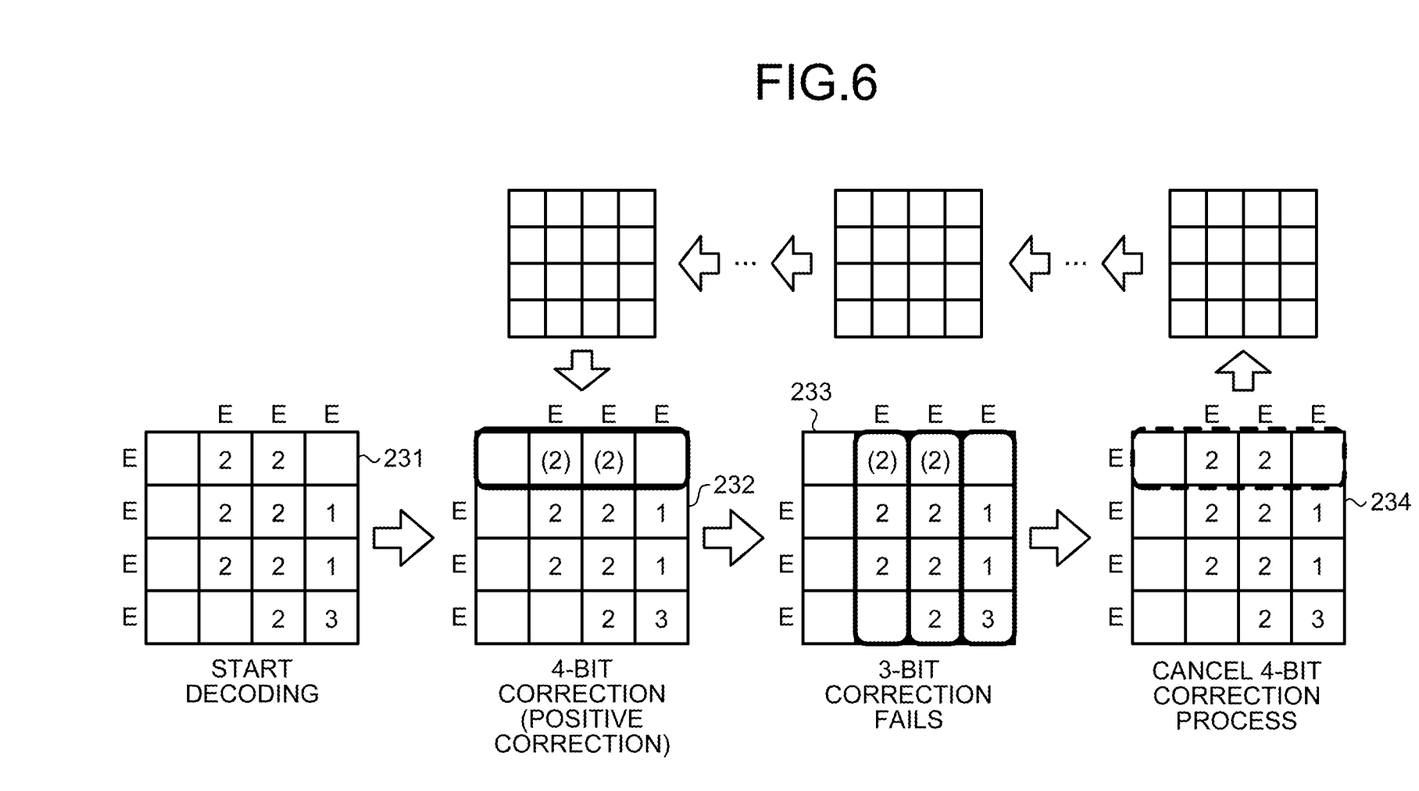
FIG. 6 is a view for describing an example of a situation where the decoding process is not progressed.

In this manner, the rollback process is executed to eliminate the erroneous correction and proceed with the decoding process. On the other hand, even in a case where the MBFD is successful without erroneous correction, if the immediately subsequent iterative decoding process fails, a situation may occur in which a decoding result obtained by the MBFD is rejected by the rollback process and the decoding process stagnates. FIG. 6 is a view for describing an example of such a situation.

Data 231 is data at the start of decoding by MBFD. The decoding unit 302 executes the MBFD on a component code in the first row to obtain decoded data 232. The data 232 is an example of data positively corrected by the MBFD (positive correction). On the other hand, a large number of errors remain in the data 232, and thus, the immediately subsequent iterative decoding process (3-bit correction processing) fails. Data 233 is an example of data in which an error has not been decreased as a result of executing the iterative decoding process on the data 232. In this case, the decoding unit 302 executes a rollback process on the data 233 to obtain data 234.

Since the data 234 is the same data as the data 231, similar processing is repeatedly executed even if the MBFD is executed thereafter. As a result, for example, it is determined that a limit value of latency is reached and the decoding has failed while the processing is repeatedly executed.

Therefore, the detection unit 303 detects stagnation of the decoding process, for example, before reaching the limit value of the latency in the embodiment. In a case where the stagnation is detected, the parameter control unit 304 changes a parameter used in the MBFD. Details of the detection unit 303 and the parameter control unit 304 will be described later.

Figure 7:
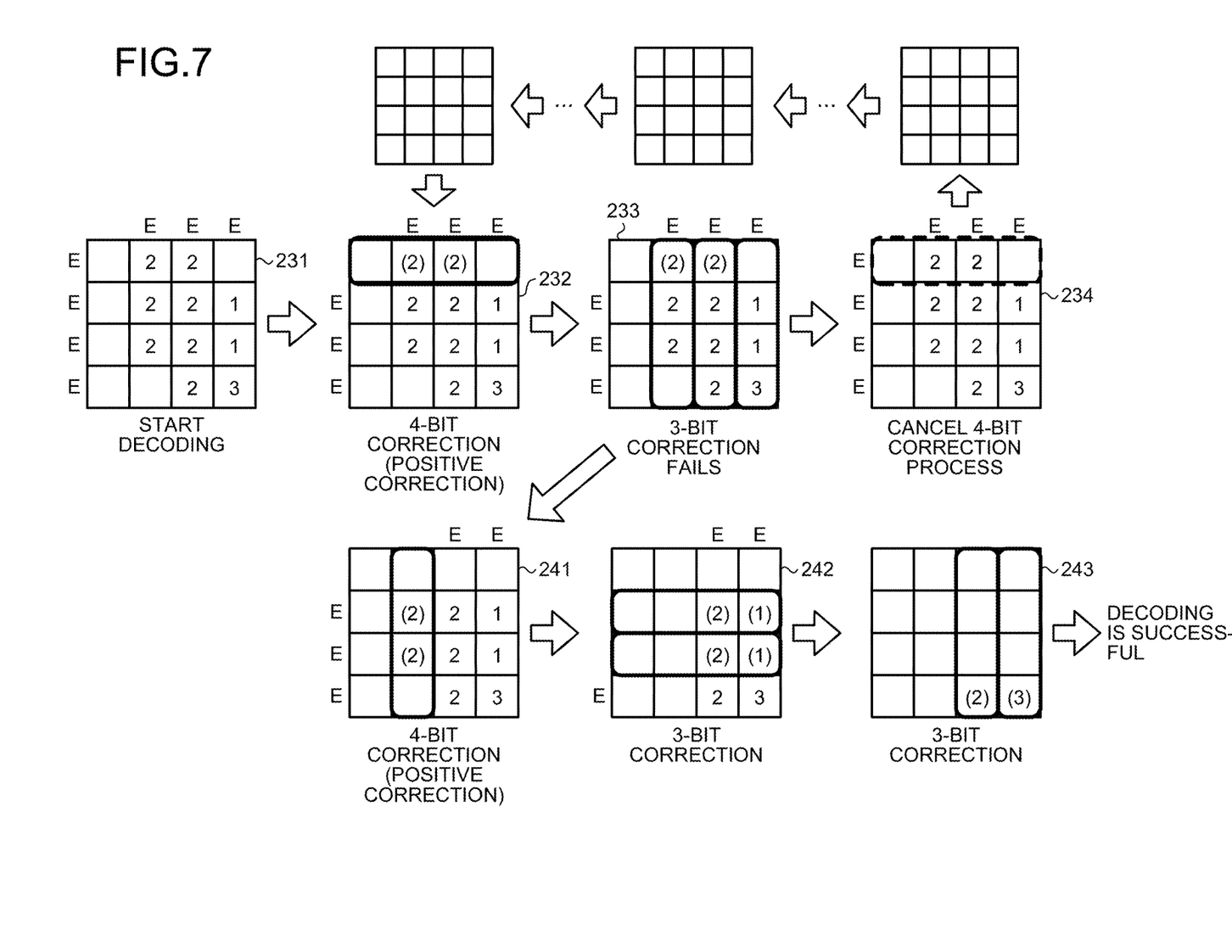
FIG. 7 is a view for describing an example of executing the decoding process by changing a parameter.

After the parameter is changed, the decoding unit 302 further executes MBFD using the changed parameter. FIG. 7 is a view for describing an example of executing MBFD by changing a parameter.

FIG. 7 illustrates an example in which information indicating whether to execute a rollback process (for example, a rollback execution flag) is changed as the parameter. For example, when the detection unit 303 detects stagnation of a decoding process, the parameter control unit 304 changes the rollback execution flag from "execute" to "not execute".

In this case, the decoding unit 302 further executes MBFD in the column direction on the data 233, for example. Data 241 is data obtained by the MBFD for the second column. Assuming that a component code in the second column has been positively corrected, data 242 in which errors in the second row and the third row have been positively corrected is obtained by immediately subsequent 3-bit correction processing in the row direction. Further, data 243 in which errors in the third column and the fourth column have been positively corrected is obtained by 3-bit correction processing in the column direction on the data 242, and the decoding process succeeds.

Next, details of a detection process performed by the detection unit 303 will be described. In order for the decoding process to proceed, it is necessary to succeed in MBFD. Therefore, the detection unit 303 determines that the decoding process is not progressed when the MBFD fails continuously in component codes of all the rows and columns among component codes in which errors have occurred. Incidentally, even if a solution is adopted once in the MBFD, the solution rejected in the rollback process is treated as a failed solution.

Hereinafter, a method for detecting stagnation of MBFD in the row direction will be described as an example. If "row" is replaced with "column", a method for detecting stagnation in the column direction can be realized. Incidentally, two methods of Detection Method 1 and Detection Method 2 will be described hereinafter, the method for detecting stagnation of MBFD is not limited thereto.

Detection Method 1

The decoding unit 302 stores the following values in a register during a decoding process. Incidentally, the register (check register or code register) is provided inside the decoding unit 302, for example. Further, it is assumed that the register (check register or code register) is initialized to a value of the first row number (for example, 1).

(V1) Value (hereinafter, referred to as CV) obtained by adding one to row number processed last in immediately previous iterative MBFD in which decoding was successful: Storage in check register.

(V2) Row number (hereinafter, referred to as SV) processed first in iterative MBFD executed immediately previously and value obtained by adding one to last processed row number (hereinafter, referred to as EV): Storage in code register.

Incidentally, when the value obtained by adding one exceeds the total number of rows, the first row number (for example, 1) is stored.

When there is an overlap between the value stored in the check register and a range determined from the values stored in the code register, the detection unit 303 detects that the decoding process in the row direction is not progressed. For example, in a case where any one of the following conditions 1 and 2 is satisfied, the detection unit 303 detects that the decoding process is not progressed.

(Condition 1) "SV<EV", "SV<CV", and "EV≥CV"

(Condition 2) "SV≥EV and SV<CV" or "SV≥EV and EV ≥CV"

Figure 8:
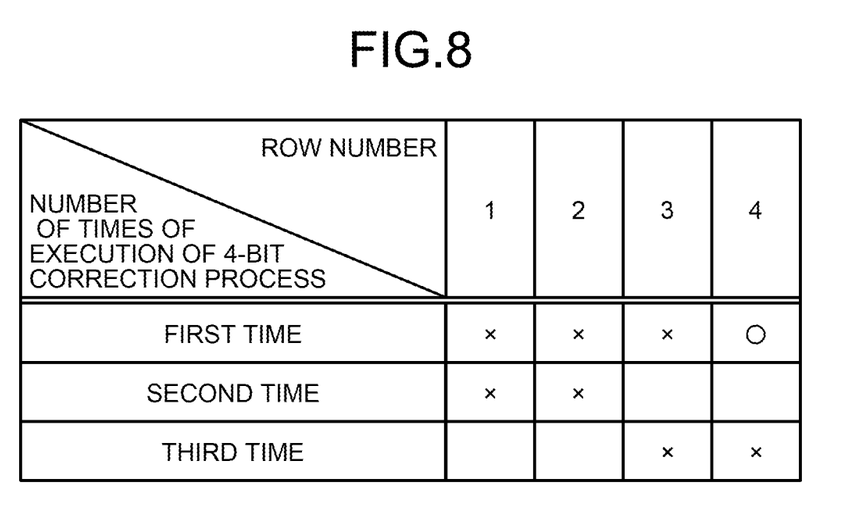
FIG. 8 is a table for describing an example of a stagnation detection process.
Figure 9:
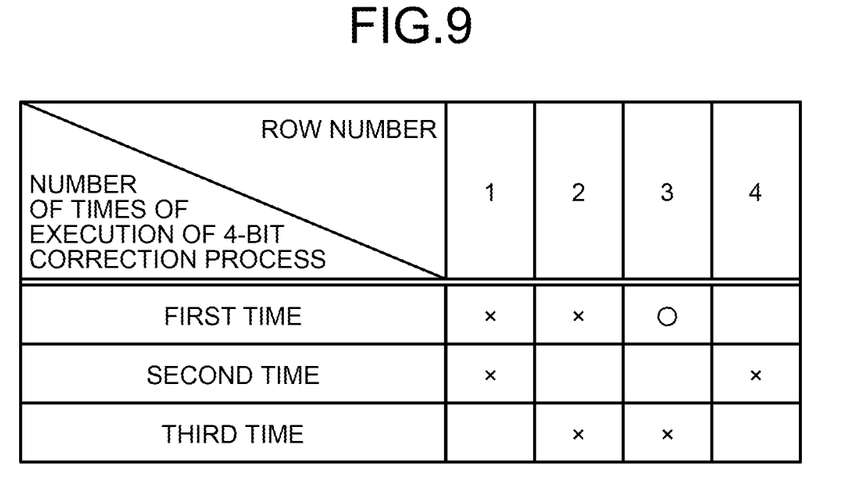
FIG. 9 is a table for describing an example of the stagnation detection process.

Hereinafter, an example of a stagnation detection process will be described. FIGS. 8 and 9 are tables for describing examples of the stagnation detection process. A symbol "o" indicates that MBFD is successful. A symbol "x" indicates that MBFD has failed (including a case where the MBFD has been rejected in a rollback process).

FIG. 8 illustrates an example in which decoding of a component code in the fourth row was successful in iterative MBFD executed first (at the first time). Further, FIG. 8 illustrates an example in which MBFD was executed on component codes in the first row and the second row in the second iterative MBFD but failed, and MBFD was executed on component codes in the third row and the fourth row in the third iterative MBFD but failed.

After executing the third iterative MBFD, the respective registers store values as follows.

Check register: CV=1
Code register: SV=3, EV=1

In this case, "SV≥EV and EV≥CV" in Condition 2 is satisfied, and thus, the detection unit 303 detects that the decoding process is not progressed.

FIG. 9 illustrates an example in which decoding of a component code in the third row was successful in iterative MBFD executed first (at the first time). Further, FIG. 9 illustrates an example in which MBFD was executed on component codes in the fourth row and the first row in the second iterative MBFD but failed, and MBFD was executed on component codes in the second row and the third row in the third iterative MBFD but failed.

After executing the third iterative MBFD, the respective registers store values as follows.

Check register: CV=4
Code register: SV=2, EV=4

In this case, Condition 1 of "SV<EV", "SV<CV", and "EV≥CV" is satisfied, the detection unit 303 detects that the decoding process is not progressed.

In the third iterative MBFD of FIG. 9, it is assumed that the MBFD failed for component codes in the second to fourth rows. In this case, after executing the third iterative MBFD, the respective registers store values as follows.

Check register: CV=4
Code register: SV=2, EV=1

In this case, "SV≥EV and SV<CV" in Condition 2 is satisfied, and thus, the detection unit 303 detects that the decoding process is not progressed.

Detection Method 2

The decoding unit 302 stores determination information indicating whether a component code includes an error in, for example, an internal register. The determination information is a binary vector or a hash value of the binary vector. Hereinafter, a case where the binary vector is used as the determination information will be described as an example. The detection unit 303 detects that a decoding process is not progressed when the binary vector does not change while MBFD is repeatedly executed.

Binary vectors are stored independently in rows and columns. Each element of the binary vector is assumed to be zero in a case where a syndrome of each component code is zero (has no error), and is assumed to be one in a case where the syndrome of each component code is not zero (has an error). For example, in a case where component codes of four rows are used, the binary vector in the row direction includes four elements corresponding to the component codes of four rows. A value indicating whether a syndrome of a corresponding component code is zero (0) or not (1) is set to each element.

The detection unit 303 independently determines the presence or absence of a change in the binary vector in the row direction and the binary vector in the column direction. For example, the detection unit 303 determines whether the binary vector has changed depending on whether a "past binary vector" and a "current binary vector" match at a timing at which processing of a certain component code (for example, a component code corresponding to the last row) ends (including a case where a syndrome already indicates no error and MBFD has been skipped) while the MBFD is repeated.

The determination may be made at the timing at which processing of any component code is completed in any manner. One component code in each of the row direction and the column direction is determined in advance as the component code indicating the determination timing.

The "past binary vector" is stored in a dedicated register for each of the row and column. The "current binary vector" corresponds to the latest binary vector obtained for a component code for which the determination timing has been determined. That is, the "current binary vector" is the binary vector obtained for the component code for which determination timing has been determined, and corresponds to a binary vector obtained by the immediately previously processed MBFD. When the "past binary vector" and the "current binary vector" stored in the register match, the detection unit 303 detects that the binary vector does not change, that is, a decoding process is not progressed.

Incidentally, in a case where the "past binary vector" and the "current binary vector" do not match, the detection unit 303 updates the register with the "current binary vector". Further, it is assumed that the register is initialized by a syndrome of each component code at a timing when MBFD has started.

Next, details of a parameter control process by the parameter control unit 304 will be described. In a case where stagnation of a decoding process is detected in both the row direction and the column direction, the parameter control unit 304 switches a parameter used in MBFD. Examples of the parameter include the following (P1) to (P4). Incidentally, the parameter control unit 304 may control any one of the following plurality of parameters or may control the plurality of parameters.

(P1) List Size: Upper Limit (Maximum Value) of Number of Solutions Adopted in MBFD The list size is determined for each component code (for example, row and column). The list size is a value equal to or larger than one and equal to or smaller than the maximum number of component codes. The parameter control unit 304 may switch the list size using, for example, the following array L defining the list size to be switched.

$L=(L_1, L_2, \ldots, \text{and } L_k)$ (k is an integer of two or more)

A value of each element of the array L is determined so as to satisfy $L_i < L_{i+1} (1 \le i \le k)$. The initial value of the list size is $L_1$, for example. The parameter control unit 304 switches the list size from $L_i$ to $L_{i+1}$ every time the stagnation of the decoding process is detected.

Incidentally, when the decoding process has progressed, the parameter control unit 304 may decrease the list size. For example, when the decoding process has progressed, the parameter control unit 304 may return the list size from $L_i$ to $L_{i-1}$ by one stage, or may return the list size to the initial value $L_i$. The progress of the decoding process means, for example, that MBFD has succeeded and a rollback process has not been executed.

In this manner, when the stagnation of the decoding process is detected, the list size is changed so as to monotonically increase in a range between one and the number of the component codes of the target dimension. Further, when the decoding process has progressed, the list size is changed so as to monotonically decrease in a range between one and the number of the component codes of the target dimension.

Incidentally, a method for changing the list size is not limited to the method using the array L. For example, the parameter control unit 304 may increase the list size by adding a predetermined value (for example, 1) or a value obtained on the basis of a rule to the initial value (for example, 1) of the list size. Similarly, for example, the parameter control unit 304 may decrease the list size by subtracting a predetermined value (for example, 1) or a value obtained on the basis of a rule from the current list size.

(P2) Rollback Execution Flag (RBFlag)

As described above, the rollback execution flag is an example of information indicating whether to execute the rollback process. For example, RBFlag=True means that the rollback process is to be executed. RBFlag=False means that the rollback process is not to be executed. For example, RBFlag=True is set as an initial value. When the stagnation of the decoding process is detected, the parameter control unit 304 makes a change to RBFlag=False.

The parameter control unit 304 may control the change of the parameter by combining the list size and the rollback execution flag. For example, when the stagnation of the decoding process is further detected in a state where the list size is changed to $L_k$ (an upper limit value of the list size), the parameter control unit 304 may make a change to RBFlag=False. As a result, for example, it is possible to employ a configuration in which decoding is carefully advanced so as not to adopt a solution that causes erroneous correction as much as possible at an initial stage of a decoding process, and the decoding process is caused to progress by making a change not to execute rollback when the decoding process stagnates.

(P3) Flip Size

A flip size means one or a plurality of the following values.
  Number or ratio of symbols to be flipped among bits incuded in intersection
  Number or ratio of intersections to be flipped among intersections included in component codes For example, when the stagnation of the decoding process is detected, the parameter control unit 304 makes a change to increase the flip size. Further, when the decoding process has progressed, the parameter control unit 304 makes a change to decrease the flip size. As a method of the increase or decrease, for example, a method similar to that in the case of the list size can be applied.

Figure 10:
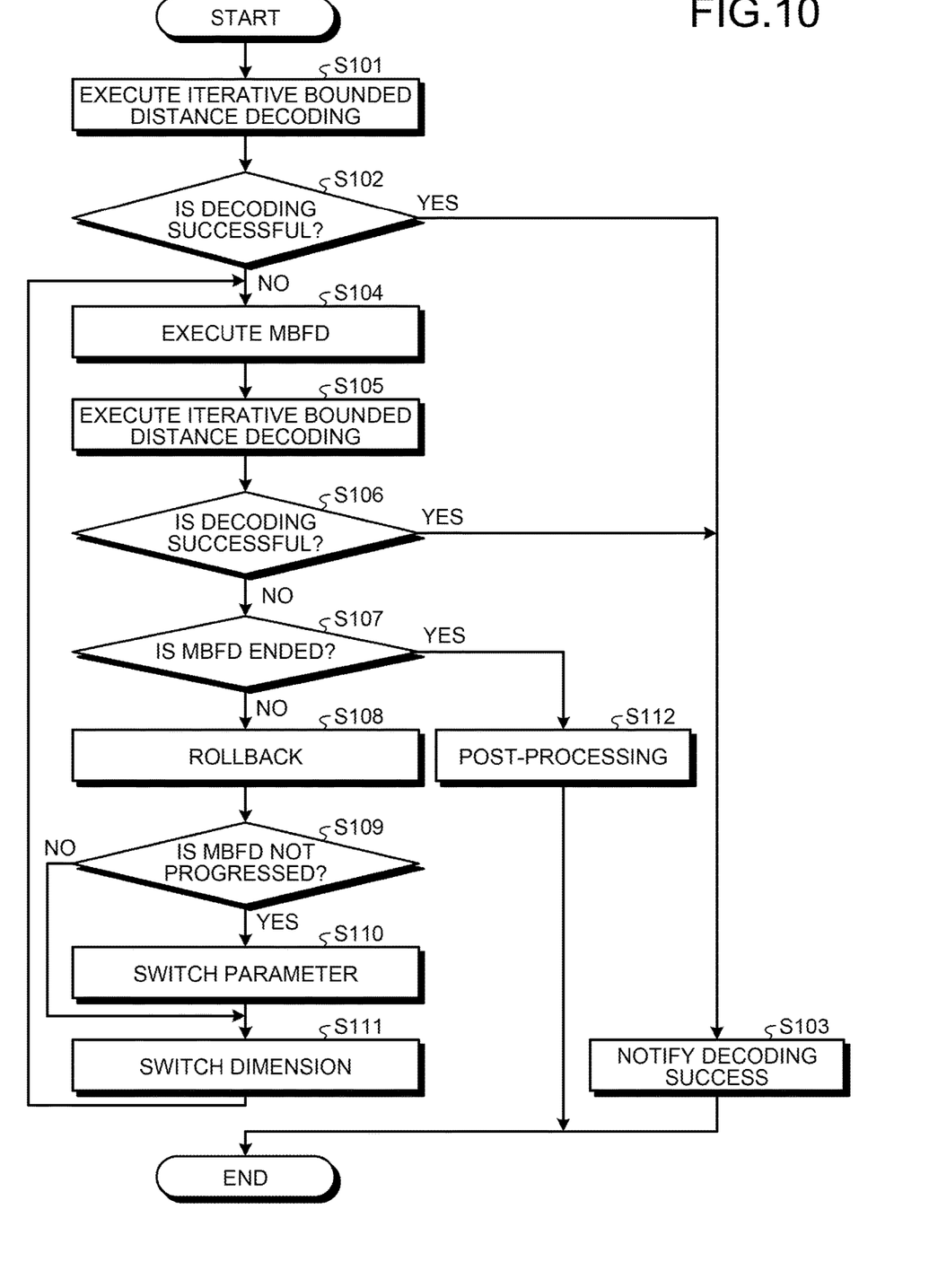
FIG. 10 is a flowchart illustrating a schematic example of a decoding operation according to the embodiment.

Next, a decoding operation according to the embodiment will be described in detail with reference to the drawings. FIG. 10 is a flowchart illustrating a schematic example of the decoding operation according to the embodiment.

The decoding unit 302 executes iterative bounded distance decoding on read information read from the non-volatile memory 20 by the memory I/F 13 (step S101). The decoding unit 302 determines whether the iterative bounded distance decoding has succeeded (step S102). For example, the decoding unit 302 obtains a syndrome of each component code after repeatedly executing the iterative bounded distance decoding until an end condition is satisfied, and determines that the iterative bounded distance decoding has failed when there is a syndrome whose value is not zero.

When the iterative bounded distance decoding is successful (step S102: Yes), the decoding unit 302 notifies the control unit 11 of the decoding success, for example (step S103). When the iterative bounded distance decoding fails (step S102: No), the encoding/decoding unit 14 executes the following steps S104 to S112.

First, the decoding unit 302 executes MBFD in either the row direction or the column direction (step S104). The decoding unit 302 further executes 3-bit iterative bounded distance decoding (step S105). The decoding unit 302 determines whether the iterative bounded distance decoding has succeeded (step S106). When the iterative bounded distance decoding is successful (step S106: Yes), the decoding unit 302 notifies the control unit 11 of the decoding success, for example (step S103).

When the iterative bounded distance decoding fails (step S106: No), the decoding unit 302 determines whether to end the MBFD (step S107). For example, the decoding unit 302 determines to end the MBFD in a case where the end condition such as a condition that the number of times of execution of the MBFD reaches an upper limit value or a condition that the latency reaches a limit value is satisfied.

When the MBFD is ended (step S107: Yes), the encoding/decoding unit 14 executes post-processing (step S112). Examples of the post-processing include still another error correction process and a process of notifying the control unit 11 of a decoding failure.

When the MBFD is not ended (step S107: No), the decoding unit 302 performs a rollback process of canceling the MBFD executed in step S104 (step S108). The detection unit 303 detects whether the decoding process is not progressed (step S109).

In a case where the stagnation is detected (step S109: Yes), the parameter control unit 304 switches a parameter used in the MBFD (step S110). After the parameter is switched and in a case where the stagnation is not detected (step S109: No), the decoding unit 302 switches a dimension (row direction or column direction) to be processed (step S111). Thereafter, returning to step S104, the processing is repeated for a component code of the switched dimension.

As described above, when the iterative bounded distance decoding fails, the decoding process (such as MBFD) exceeding the bounded distance is executed in units of component codes in the embodiment. Further, whether the decoding process is not progressed due to rollback or the like is detected. Then, when the stagnation of the decoding process is detected, the parameter of the decoding process is changed, so that the decoding process is further executed. As a result, it is possible to enhance the possibility that the decoding process is successful, that is, it is possible to improve the error correction (decoding) capability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a non-volatile memory configured to store data encoded by a plurality of error correction codes in which each of a plurality of symbol groups is protected by a plurality of component code groups; and
   a memory controller configured to:
   execute a first decoding process of reading the data encoded by the error correction codes from the non-volatile memory and repeatedly executing bounded distance decoding on the symbol group protected by each of component codes included in the plurality of component code groups;
   execute a second decoding process of repeatedly executing decoding that exceeds a bounded distance in units of component codes for error symbol groups, the error symbol group determined to include an error due to a syndrome of component codes included in the plurality of component code groups when the first decoding process fails;
   execute a rollback process of returning to data before the execution of the second decoding process when the first decoding process executed after the second decoding process fails; and
   change a parameter used in the second decoding process and further execute the second decoding process using the changed parameter when detecting that the second decoding process is not progressed.

2. The memory system according to claim 1, wherein the second decoding process includes a process of correcting an error after inverting values of one or more symbols included in the error symbol group.

3. The memory system according to claim 2, wherein the parameter is at least one of a maximum value of a number of times of successful decoding in units of component codes in the second decoding process or information indicating whether to execute the rollback process.

4. The memory system according to claim 3, wherein
the parameter is the maximum value of the number of times of successful decoding in units of component codes in the second decoding process and the information indicating whether to execute the rollback process, and the memory controller is further configured to:

increase the maximum value and execute the second decoding process using the increased maximum value when detecting that the second decoding process is not progressed; and change the information indicating whether to execute the rollback process to a value indicating that the rollback process is not to be executed, and further execute the second decoding process when stagnation of the second decoding process is further detected after the maximum value reaches an upper limit value.

5. The memory system according to claim 2, wherein the parameter is a maximum value of the number of times of successful decoding in units of component codes in the second decoding process, and the memory controller is configured to increase the maximum value and execute the second decoding process using the increased maximum value when detecting that the second decoding process is not progressed.

6. The memory system according to claim 5, wherein the memory controller is configured to decrease the increased maximum value and execute the second decoding process using the decreased maximum value when detecting that the second decoding process is progressed.

7. The memory system according to claim 2, wherein the parameter is at least one of a number of symbols to be inverted or a number of the error symbol groups in which the symbols are to be inverted.

8. The memory system according to claim 1, wherein
each of the plurality of component code groups is a BCH code or a Reed-Solomon code.

9. The memory system according to claim 1, wherein
the memory controller is configured to detect that the second decoding process is not progressed when the second decoding process fails for all the error symbol groups.

10. The memory system according to claim 9, wherein
the memory controller is configured to detect that the second decoding process is not progressed in a case where determination information does not change when the second decoding process is repeatedly executed, the determination information indicating whether the plurality of component code groups include an error.

11. A method for controlling a non-volatile memory, the method comprising:

executing a first decoding process of reading data from the non-volatile memory and repeatedly executing bounded distance decoding on a plurality of symbol groups protected by each of component codes included in a plurality of component code groups, the non-volatile memory storing the data encoded by a plurality of error correction codes in which each of the plurality of symbol groups is protected by the plurality of component code groups, the data encoded by the error correction codes;

executing a second decoding process of repeatedly executing decoding that exceeds a bounded distance in units of component codes for error symbol groups, the error symbol group determined to include an error due to a syndrome of component codes included in the plurality of component code groups when the first decoding process fails;

executing a rollback process of returning to data before the execution of the second decoding process when the first decoding process executed after the second decoding process fails; and changing a parameter used in the second decoding process and further executing the second decoding process using the changed parameter when detecting that the second decoding process is not progressed.

12. The method according to claim 11, wherein
the second decoding process includes a process of correcting an error after inverting values of one or more symbols included in the error symbol group.

13. The method according to claim 12, wherein
the parameter is at least one of a maximum value of a number of times of successful decoding in units of component codes in the second decoding process and information indicating whether to execute the rollback process.

14. The method according to claim 13, wherein
the parameter is the maximum value of the number of times of successful decoding in units of component codes in the second decoding process and the information indicating whether to execute the rollback process, the method further comprising:

increasing the maximum value and executing the second decoding process using the increased maximum value when detecting that the second decoding process is not progressed; and changing the information indicating whether to execute the rollback process to a value indicating that the rollback process is not to be executed, and further executing the second decoding process when stagnation of the second decoding process is further detected after the maximum value reaches an upper limit value.

15. The method according to claim 12, wherein
the parameter is a maximum value of the number of times of successful decoding in units of component codes in the second decoding process, the method further comprising increasing the maximum value and executing the second decoding process using the increased maximum value when detecting that the second decoding process is not progressed.

16. The method according to claim 15, further comprising
decreasing the increased maximum value and executing the second decoding process using the decreased maximum value when detecting that the second decoding process is progressed.

17. The method according to claim 12, wherein
the parameter is at least one of a number of symbols to be inverted or a number of the error symbol groups in which the symbols are to be inverted.

18. The method according to claim 11, wherein
each of the plurality of component code groups is a BCH code or a Reed-Solomon code.

19. The method according to claim 11, further comprising
detecting stagnation of the second decoding process when the second decoding process fails for all the error symbol groups.

20. The method according to claim 19, further comprising
detecting stagnation of the second decoding process in a case where determination information does not change when the second decoding process is repeatedly executed, the determination information indicating whether the plurality of component code groups include an error.

* * * * *